(12) United States Patent
Kapusta et al.

(10) Patent No.: US 10,770,382 B2
(45) Date of Patent: Sep. 8, 2020

(54) LOW INDUCTANCE STACKABLE SOLID-STATE SWITCHING MODULE AND METHOD OF MANUFACTURING THEREOF

(71) Applicant: General Electric Company, Schenectady, NY (US)

(72) Inventors: Christopher James Kapusta, Delanson, NY (US); Ramanujam Ramabhadran, Niskayuna, NY (US); Kum-Kang Huh, Niskayuna, NY (US); Brian Lynn Rowden, Ballston Lake, NY (US); Glenn Scott Claydon, Wynantskill, NY (US); Ahmed Elasser, Latham, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/203,777

(22) Filed: Nov. 29, 2018

(65) Prior Publication Data
US 2020/0176360 A1  Jun. 4, 2020

(51) Int. Cl.
*H01L 23/498* (2006.01)
*H01L 23/64* (2006.01)
(Continued)

(52) U.S. Cl.
CPC ............ *H01L 23/498* (2013.01); *H01L 21/56* (2013.01); *H01L 23/5385* (2013.01);
(Continued)

(58) Field of Classification Search
CPC . H01L 23/498; H01L 23/5385; H01L 23/645; H01L 29/2003; H01L 24/17; H01L 21/56; H01L 2924/1033
See application file for complete search history.

(56) References Cited

U.S. PATENT DOCUMENTS 7,291,869 B2 * 11/2007 Otremba ........... H01L 23/49575
257/107
7,786,486 B2   8/2010 Casey et al.
(Continued)

FOREIGN PATENT DOCUMENTS

CN         104157634 B      4/2017

OTHER PUBLICATIONS

Luo et al., "Design Considerations for GaN HEMT Multichip Half-bridge Module for High-Frequency Power Converters," 2014 IEEE Applied Power Electronics Conference and Exposition—APEC 2014, Fort Worth, TX, USA, Mar. 16-20, 2014, pp. 537-544.

*Primary Examiner* — Sitaramarao S Yechuri
(74) *Attorney, Agent, or Firm* — Ziolkowski Patent Solutions Group, SC

(57) ABSTRACT

A modular electronics package is disclosed that includes a first and second electronics packages, with each of the first and second electronics packages including a metallized insulating substrate and a solid-state switching device positioned on the metallized insulating substrate, the solid-state switching device comprising a plurality of contact pads electrically coupled to the first conductor layer of the metallized insulating substrate. A conductive joining material is positioned between the first electronics package and the second electronics package to electrically connect them together. The first electronics package and the second electronics package are stacked with one another to form a half-bridge unit cell, with the half-bridge unit cell having a current path through the solid-state switching device in the first electronics package and a close coupled return current path through the solid-state switching device in the second electronics package in opposite flow directions.

27 Claims, 11 Drawing Sheets

(51) Int. Cl.
　　　*H01L 23/538*　　　(2006.01)
　　　*H01L 23/00*　　　(2006.01)
　　　*H01L 29/20*　　　(2006.01)
　　　*H01L 21/56*　　　(2006.01)

(52) U.S. Cl.
　　　CPC ............ *H01L 23/645* (2013.01); *H01L 24/17* (2013.01); *H01L 29/2003* (2013.01); *H01L 2924/1033* (2013.01)

(56) References Cited

U.S. PATENT DOCUMENTS

| | | | |
|---|---|---|---|
| 9,105,560 B2 | 8/2015 | Roberts et al. | |
| 9,107,290 B1 * | 8/2015 | Chen | H05K 3/0061 |
| 9,589,868 B2 | 3/2017 | McKnight-MacNeil et al. | |
| 9,640,471 B2 | 5/2017 | Kinzer | |
| 9,818,692 B2 | 11/2017 | Roberts et al. | |
| 2007/0132079 A1 * | 6/2007 | Otremba | H01L 23/3107 257/685 |
| 2007/0229143 A1 * | 10/2007 | Eckhardt | H01L 23/5389 327/440 |
| 2008/0185708 A1 * | 8/2008 | Chen | H01L 23/49811 257/698 |
| 2009/0067135 A1 * | 3/2009 | Hirai | H01L 23/3107 361/715 |
| 2009/0273905 A1 * | 11/2009 | Park | H01L 23/49816 361/737 |
| 2009/0289336 A1 * | 11/2009 | Meghro | H01L 21/50 257/676 |
| 2011/0201152 A1 * | 8/2011 | Harayama | H01L 24/97 438/107 |
| 2016/0079223 A1 * | 3/2016 | Wu | H01L 27/0883 438/107 |
| 2017/0154877 A1 * | 6/2017 | Tanimoto | H01L 25/18 |
| 2018/0090441 A1 | 3/2018 | Traub et al. | |
| 2020/0029455 A1 * | 1/2020 | Hong | H01L 23/49 |

* cited by examiner

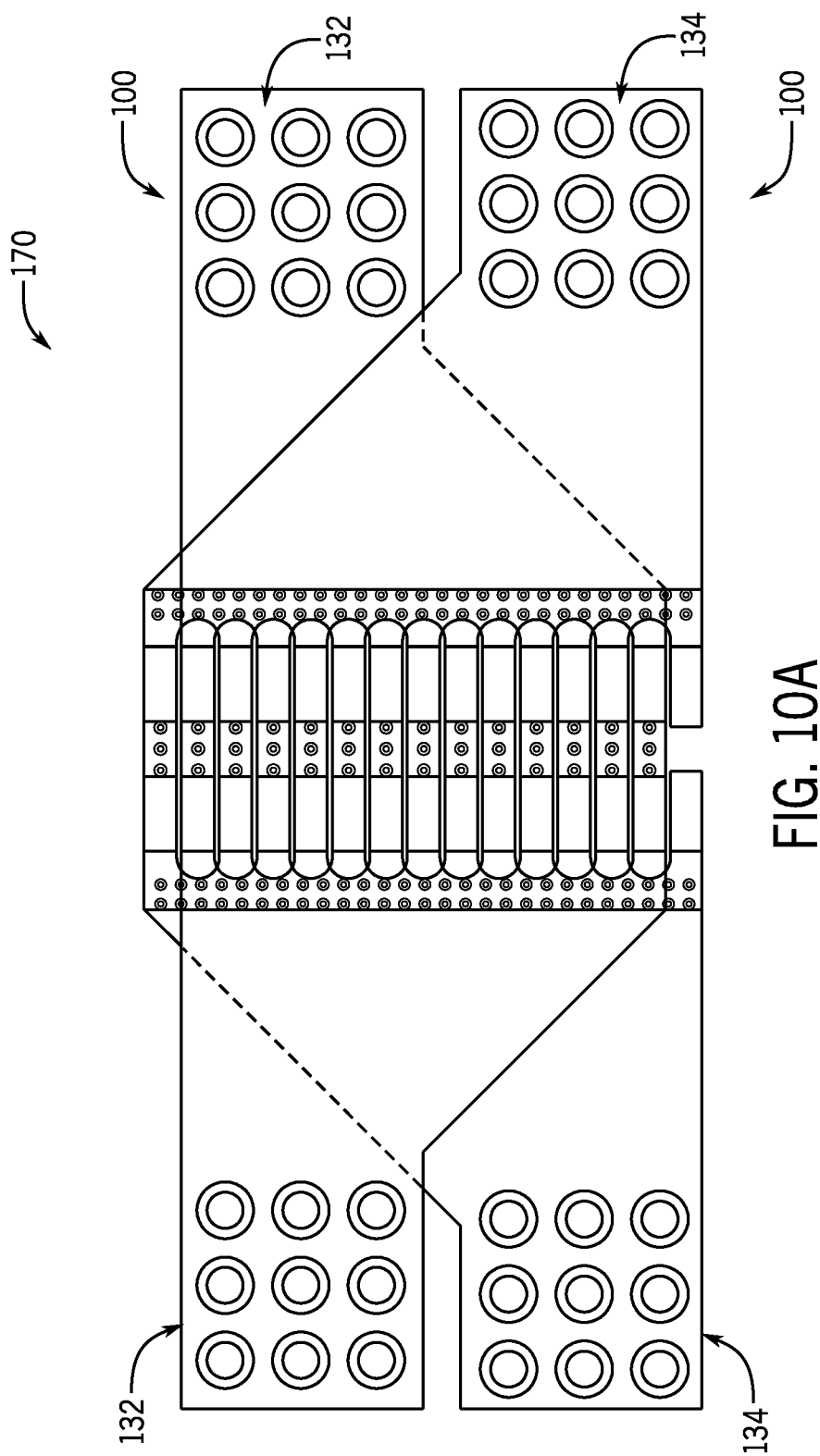

LOW INDUCTANCE STACKABLE SOLID-STATE SWITCHING MODULE AND METHOD OF MANUFACTURING THEREOF

BACKGROUND OF THE INVENTION

Embodiments of the invention relate generally to electronics packages and, more particularly, to stackable electronics packages for stacking solid-state switching devices in a modular fashion and with low inductance.

Wide-bandgap semiconductor devices are expected to be widely adopted for power switches as production costs are reduced, with Gallium Nitride (GaN) and silicon carbide (SiC) transistors being prime examples of such devices. These devices offer low on-resistance and high current capability per unit active area of the device and provide the capability for high speed switching, high band width, and high-power density. However, it is known that wide-bandgap semiconductor devices are highly sensitive to packaging layout, as the proximity of circuitry in the packaging—as well as additional gate driver, bus capacitors, and power connectors in the packaging—affects the performance of the devices due to parasitic impedance. Even good standard packaging concepts can add several nH of inductance to a device commutation loop, but for the speed of most wide-bandgap semiconductor devices, the total commutation loop needs to be below 1 nH to achieve device level performance.

Additionally, the high current capability of wide-bandgap semiconductor devices means that such devices often carry high current densities. This carrying of high current densities makes wide-bandgap semiconductor devices less compatible with traditional PCB style design rules, as the copper thickness and via dimensions usually suitable for high frequency designs are not well suited for high current operation. The ability to package a single device is one hurdle based on the above identified issues, but packaging becomes more of a challenge when design requirements call for packaging of multiple devices, such as in a half-bridge arrangement or the arrangement of several devices in parallel to achieve the required current.

Accordingly, it would be desirable to provide a low inductance electronics package for wide-bandgap semiconductor devices that can reduce the overall commutation loop to less than 1 nH, and preferably less than 0.5 nH, for a half-bridge configuration, without additional electromagnetic interference or localized bus capacitance. It would also be desirable for the electronics package design to support the integration of many devices and to provide a low profile that allows for integration of the package into space constrained areas and devices, such as wheel wells or motor housings.

BRIEF DESCRIPTION OF THE INVENTION

In accordance with one aspect of the invention, a modular electronics package includes a pair of electronics packages comprising a first electronics package and a second electronics package, with each of the first and second electronics packages including a metallized insulating substrate comprising an insulating layer and a first conductor layer positioned on the insulating layer and a solid-state switching device positioned on the metallized insulating substrate, the solid-state switching device comprising a plurality of contact pads electrically coupled to the first conductor layer of the metallized insulating substrate. The modular electronics package also includes a conductive joining material positioned between the first electronics package and the second electronics package to electrically connect the first electronics package to the second electronics package. The first electronics package and the second electronics package are stacked with one another to form a half-bridge unit cell, with the half-bridge unit cell having a current path through the solid-state switching device in the first electronics package and a close coupled return current path through the solid-state switching device in the second electronics package in opposite flow directions.

In accordance with another aspect of the invention, a method of manufacturing a half-bridge unit cell includes providing a first electronics package and a second electronics package of identical construction, with each of the first and second electronics packages including a metallized insulating substrate comprising an insulating layer and a metal layer positioned on the insulating layer and a solid-state switching device positioned on the metallized insulating substrate and electrically coupled thereto. The method also includes forming a plurality of through-vias in the metallized insulating substrate of each of the first and second electronics packages that extend through the metallized insulating substrate and vertically stacking the first electronics package with the second electronics package, with the plurality of through-vias in the metallized insulating substrate of the first electronics package being aligned with the plurality of through-vias in the metallized insulating substrate of the second electronics package. The method further includes physically and electrically coupling the first electronics package with the second electronics package to form a commutation loop in the half-bridge unit cell.

In accordance with yet another aspect of the invention, a half-bridge unit cell includes a first electronics package comprising a first wide-bandgap semiconductor switch coupled to a first metallized insulating substrate, the first wide-bandgap semiconductor switch electrically connected to a conductor layer of the first metallized insulating substrate and a second electronics package comprising a second wide-bandgap semiconductor switch coupled to a second metallized insulating substrate, the second wide-bandgap semiconductor switch electrically connected to a conductor layer of the second metallized insulating substrate. The first electronics package is stacked vertically with the second electronics package and electrically coupled thereto to form a commutation loop in the half-bridge unit cell, with an inductance of the commutation loop in the half-bridge unit cell being 0.5 nH or less.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIGS. 10A and 10B are top plan views of the half-bridge unit cell of FIG. 9 according to embodiments of the invention.

DETAILED DESCRIPTION

Embodiments of the present invention provide a modular electronics package for packaging wide-bandgap semiconductor devices. A wide-bandgap semiconductor device, such as a GaN field-effect transistor (FET) or other solid-state switching device, for example, is packaged within a modular electronics package that may be stacked with other like packages to provide for arrangement of multiple switches in a low inductance arrangement. The arrangement of stacked electronics packages provides for formation of half-bridge arrangements and other switching module constructions with a low inductance commutation loop.

According to an exemplary embodiment of the invention, a modular package structure is provided for packaging a GaN FET, and thus embodiments of the invention are described below with reference being made to such GaN transistors. However, it is recognized that the modular package structure may be used to package other solid-state switching devices or wide-bandgap semiconductor devices instead. That is, the packaging structures described herein may be used with solid-state semiconductor switches other than GaN transistors. While embodiments described and illustrated here below refer specifically to GaN transistors, it is recognized that other solid-state semiconductor switches could be used instead, including insulated-gate bipolar transistor (IGBTs), integrated gate-commutated thyristors (IGCTs), or diodes, for example, and thus embodiments of the invention are not meant to be limited to GaN transistors. Furthermore, the solid-state switches can be made with Silicon (Si), Silicon Carbide (SiC), or any suitable semiconductor material, and are not to be limited to GaN switches/devices only. Still further, the modular package structure may be used to package other electronic components and semiconductor devices, and thus such embodiments are understood to be within the scope of the invention.

Figure 1:
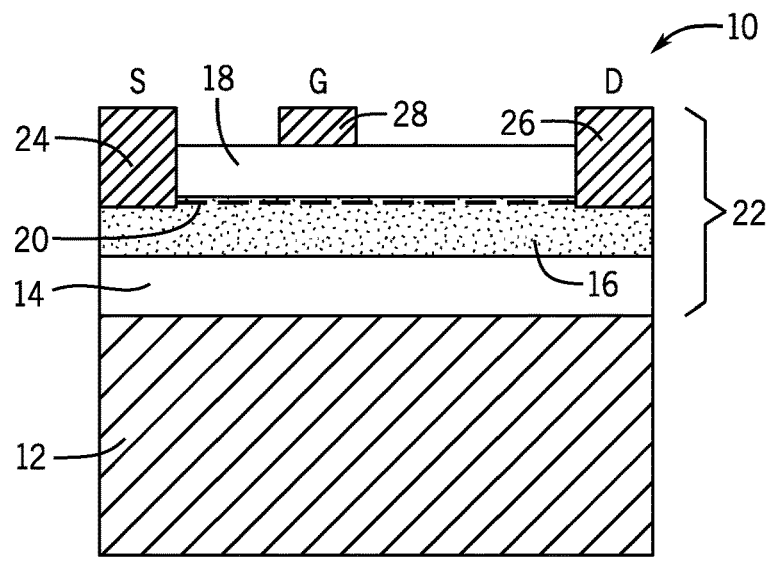
FIG. 1 is a simplified schematic cross-sectional diagram of a known GaN power transistor.

Referring first to FIG. 1, a simplified cross-sectional view of a conventional lateral GaN power transistor 10 fabricated on a silicon substrate 12 is illustrated. The GaN semiconductor layers comprise one or more buffer layers or intermediate layers 14, a GaN layer 16, and an overlying AlGaN layer 18, which are formed epitaxially on the native silicon substrate 12. The latter may be referred to as the growth substrate. The GaN/AlGaN heterostructure layers 16/18 create a 2DEG active region 20 in device regions of the GaN-on-Si substrate. The stack of GaN epitaxial layers that is formed on the silicon substrate, i.e. intermediate layers 14, GaN layer 16, and AlGaN layer 18, and any intervening layers not actually illustrated, will be referred to below as the "epi-layer stack" or "epi-stack" 22. After formation of the epi-stack 22, source, drain and gate electrodes are formed. For example, a conductive metal layer, e.g. a layer of aluminum/titanium (Al/Ti) which forms an ohmic contact with the underlying GaN heterostructure layer, is deposited to define a source electrode 24 and a drain electrode 26. A gate electrode 28, is also defined over the channel region between the source and drain electrodes, e.g. a palladium (Pd) gate electrode. While the GaN power transistor 10 is described above as being fabricated on a silicon substrate 12, it is recognized that the GaN power transistor 10 could be fabricated on other suitable substrates, such as GaN on Sapphire, GaN on SiC, or bulk GaN.

Figure 2:
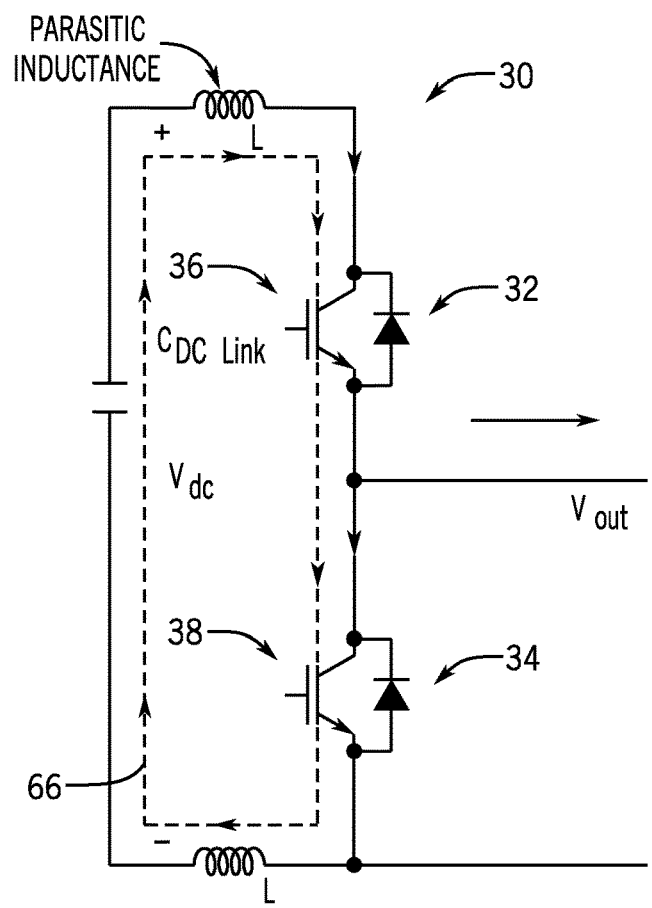
FIG. 2 is a circuit diagram of a known half-bridge circuit topology of a fundamental building block for a power converter.

Referring now to FIG. 2, a schematic diagram of a half-bridge circuit topology of a fundamental building block for a power converter is illustrated in which embodiments of the invention may be implemented. The half-bridge circuit 30 includes a pair of diodes 32, 34 arranged with associated switches 36, 38, such as GaN transistors as illustrated in FIG. 1, that may be controlled to provide a desired power conversion. In one example, the half-bridge circuit may be controlled according to a pulse-width modulation (PWM) scheme to convert DC voltage ($V_{dc}$) to an AC waveform on the voltage output ($V_{out}$) to control an AC load, such as an AC motor for example. In another example, the half-bridge circuit 30 may be used for one phase of a single- or multi-phase DC-to-DC converter.

Figure 3:
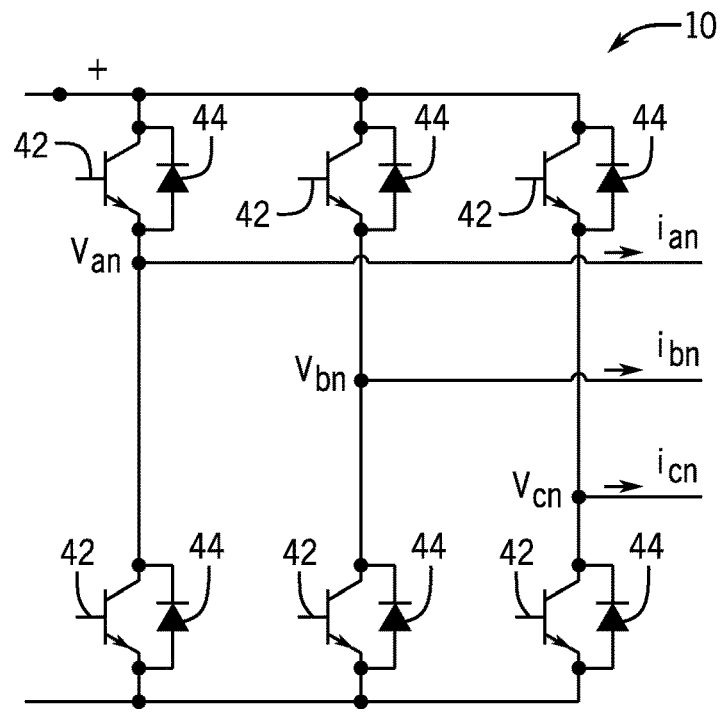
FIG. 3 is a schematic diagram of a three phase DC-AC inverter utilizing half-bridge circuits as phase legs in the inverter.

Power converters having various topologies can incorporate half-bridge circuit(s) 30 such as are shown in FIG. 2, and it is recognized that embodiments of the present invention may be incorporated into, and utilized with, any of a number of power converter topologies. As one example, and as illustrated in FIG. 3, half-bridge circuits 30 may be utilized as phase legs in a pulse width modulated (PWM) inverter 40 that synthesizes AC voltage waveforms with a fixed frequency and amplitude for delivery to a load, such as an induction motor. According to an exemplary embodiment, the inverter is comprised of a series of GaN transistors 42 (or other suitable solid-state switches) and anti-parallel diodes 44, such as an arrangement of six GaN MOSFETs 42 and diodes 22, that collectively form the PWM inverter 40, although it is recognized that other embodiments of the invention contemplate other power switching devices as known in the art, such as IGBTs, for example.

Figure 4:
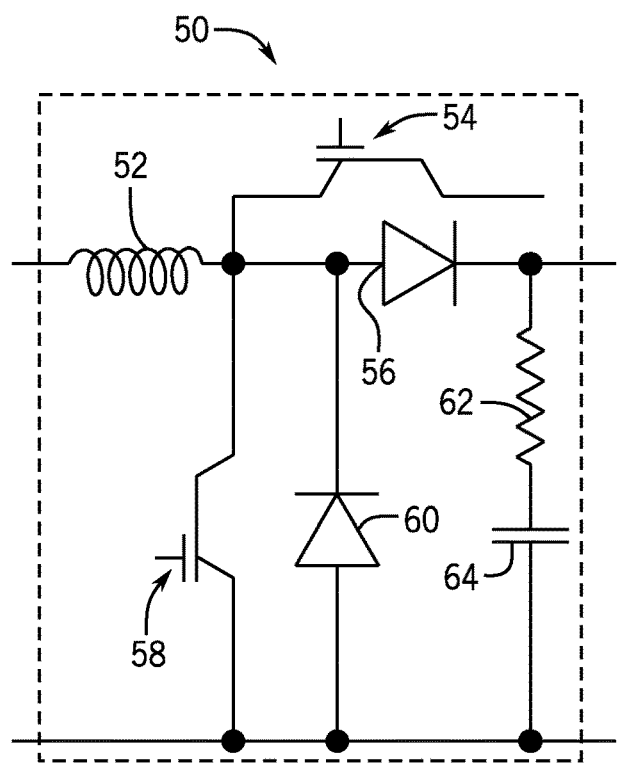
FIG. 4 is a schematic diagram of a buck-boost DC-DC converter utilizing half-bridge circuits.

As another example, and as illustrated in FIG. 4, half-bridge circuits 30 may be incorporated into a buck-boost (i.e., bidirectional) power converter 50 that selectively generates an output voltage magnitude that is greater than an input voltage magnitude ("boost") or generates an output voltage magnitude that is less than an input voltage magnitude ("buck"). A buck-boost converter 50 of well-known type is illustrated in FIG. 4 as having an input filter inductor 52 coupled in series with the parallel combination of a first switching device 54 and an antiparallel diode 56. The parallel combination of a second switching device 58 and an antiparallel diode 60 is coupled between the negative dc link voltage $-V_{dc}$ and the junction joining filter inductor 52 and switching device 54. The series combination of a snubber resistor 62 and a snubber capacitor 64 is coupled between the negative dc link voltage $-V_{dc}$ and the cathode of diode 56.

When fabricating half-bridge circuit(s) and power converters implementing half-bridge circuit(s) such as those illustrated in FIGS. 2-4, it is recognized that it desirable to package the GaN transistors or other solid-state semiconductor switches in the half-bridge circuit(s) in a manner that provides a low inductance commutation loop, such as indicated by inductance loop 66 in FIG. 2, so as to maximize performance of the device. Embodiments of the invention provide modular electronics packages that allow for the stacking of multiple switches in a low inductance arrangement, thereby providing for formation of half-bridge circuits with a low inductance commutation loop. Desirably, the modular electronics packages of the present invention can reduce the overall commutation lop in a half-bridge configuration to 0.5 nH or less.

Figure 5:
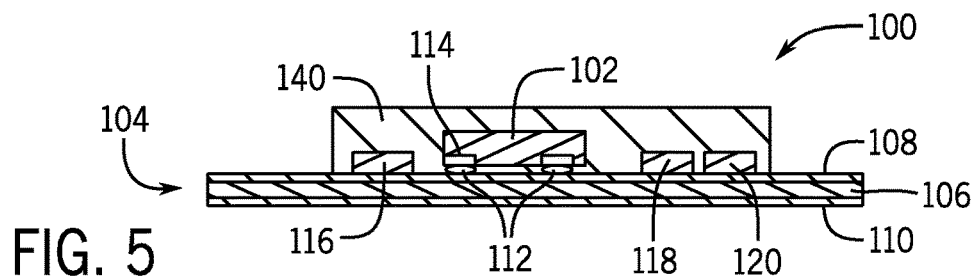
FIG. 5 is a schematic cross-sectional diagram of a modular electronics package for packaging a wide-bandgap semiconductor device, according to an embodiment of the invention.

Referring now to FIG. 5, a cross-sectional schematic diagram of a modular electronics package 100 for packaging an electrical component 102 is illustrated according to one embodiment. As indicated previously, the electrical component 102 may be in the form of a GaN transistor or other wide-bandgap semiconductor device, with the component being referred to hereafter as a GaN transistor or device 102, with it being understood that the GaN transistor could have a construction as illustrated in FIG. 1. The GaN transistor 102 is attached to a metallized insulating substrate 104 that is formed of an insulating layer 106, a top metal layer 108 (i.e., top conductor layer) positioned on a top surface of the insulating layer 106, and a bottom metal layer 110 (i.e., bottom conductor layer) positioned on a bottom surface of the insulating layer 106. According to the embodiment of FIG. 5, the GaN transistor 102 is attached to the metallized insulating substrate 104 via a flip-chip attachment, with a solder material or other conductive material 112 used to physically and electrically connect the GaN transistor 102 to the top metal layer 108—with the solder material 112 forming electrical connections with a plurality of contact pads 114 on the transistor (including source, drain, and gate pads). Electronics package 100 also includes a gate driver 116, and optionally includes associated resistor 118 and capacitor 120—with each of these components being coupled to top metal layer 108 according to the illustrated embodiment. According to an exemplary embodiment, gate driver 116 may be oriented 90 degrees from the GaN transistor 102.

According to various embodiments, insulating layer 106 may be provided in the form of an insulating film or dielectric substrate, such as for example a Kapton® laminate flex, an organic film, or substrate comprising polyimide, epoxy, BT resin, although other suitable materials may also be employed, such as Ultem®, polytetrafluoroethylene (PTFE), or another polymer film, such as a liquid crystal polymer (LCP) or a polyimide substrate, or inorganic substrates such as Si, SiC, AlN, ceramic, or glass, as non-limiting examples.

Figure 6A:
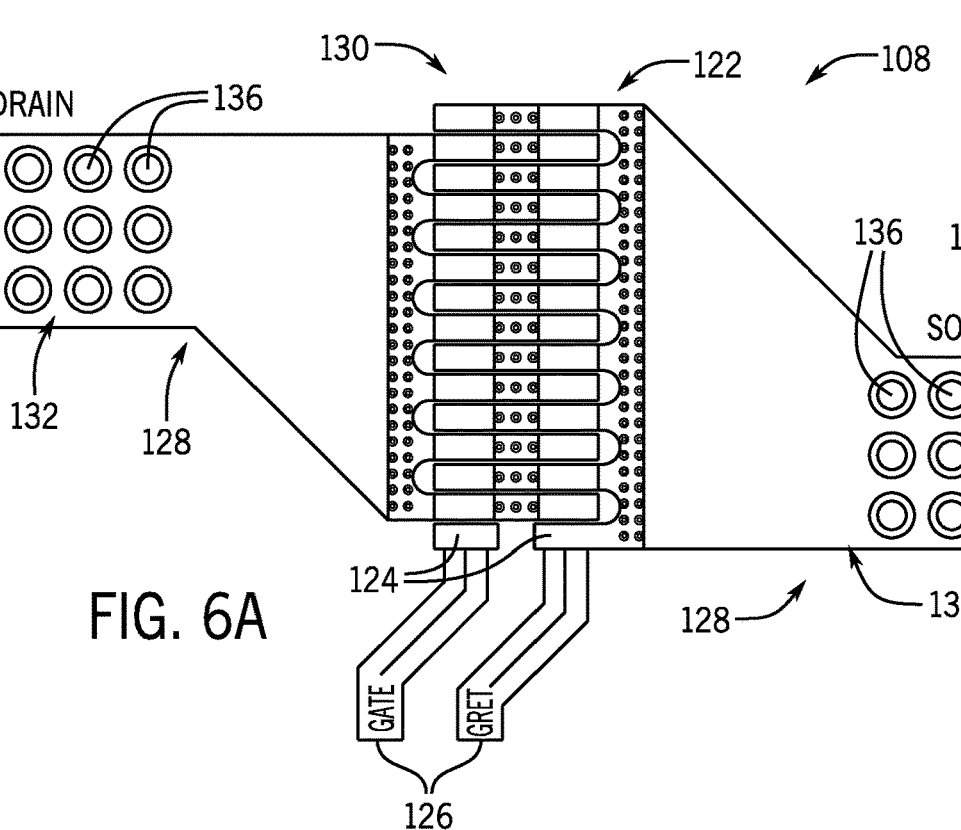
FIGS. 6A and 6B are plan views of top and metal layers of a metallized insulating substrate included in the electronics package of FIG. 5, according to an embodiment of the invention.
Figure 6B:
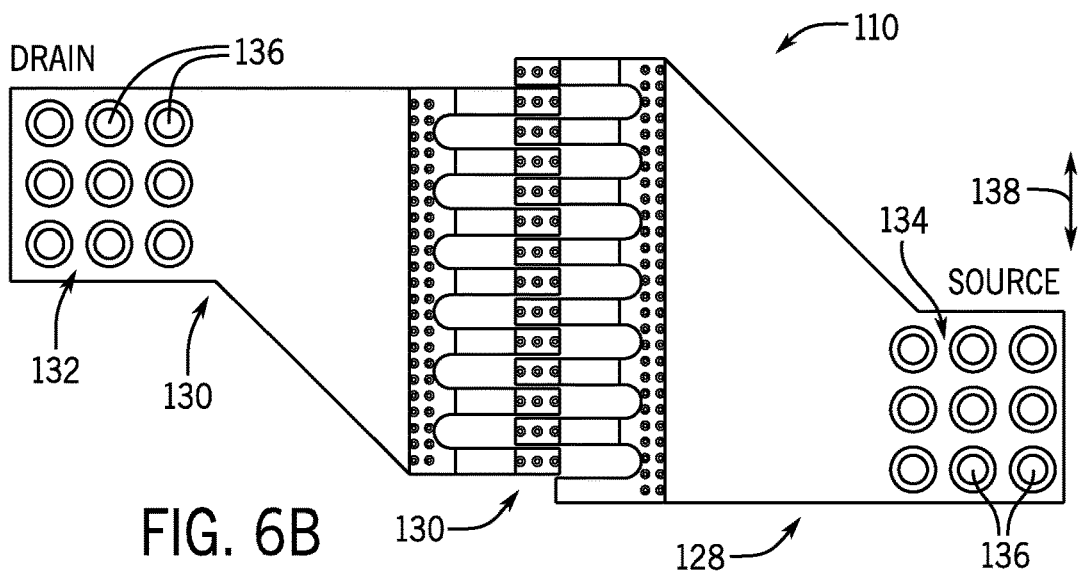

Referring now to FIGS. 6A and 6B, detailed views of top metal layer 108 and bottom metal layer 110 are illustrated, respectively. According to an embodiment, each of top metal layer 108 and bottom metal layer 110 may be formed of copper or another suitable electrically conductive metallic material. The top metal layer 108 and bottom metal layer 110 may be provided as metal foils bonded to the insulating layer 106, according to an exemplary embodiment. Top metal layer 108 includes a device attachment area 122 where GaN transistor 102 is attached, with contact pads of GaN transistor 102 being coupled to device attachment area 122 via solder bump connections in a flip-chip type attachment. Top metal layer 108 also provides connection points 124 to which gate connections 126 may be attached/formed to operatively connect gate driver 116 to GaN transistor 102—with gate in and gate out connections 126 being connected/formed to device attachment area 122 of top metal layer 108. Each of top metal layer 108 and bottom metal layer 110 further includes protrusions 128 extending out from a central area 130 (where attachment area 122 is located), with drain and source connections 132, 134 being provided on the protrusions 128. Conductive package through vias 136 are formed through metallized insulating substrate 104 at the drain and source connections 132, 134 to provide electrical connectivity through the electronics package 100. As can be seen in FIGS. 5A and 5B, the drain and source connections 132, 134 are offset from one another in a direction 138, with this offset enabling stacking of electronics packages 100, as will be explained in greater detail below.

Referring back now to FIG. 5, electronics package 100 also includes a molding resin or encapsulant 140 (i.e., glob top) that surrounds the GaN transistor 102 and associated gate driver 116, capacitor 118, and resistor 120. According to an embodiment, encapsulant 140 is an organic resin containing fillers to reduce its thermal coefficient of expansion, which is less than 40 PPM/C or less than 30 PPM/C. Alternatively, encapsulant 140 may be a polymer such as, for example, an epoxy material, a pre-preg material, an inorganic material, a composite dielectric material, or any other electrically insulating organic or inorganic material. The top surface of encapsulant 140 presents a planar surface that enables positioning of the electronics package 100 adjacent an electronics package 100 of similar/identical construction—with a back-to-back arrangement of such packages made possible by such a planar surface.

Figure 7:
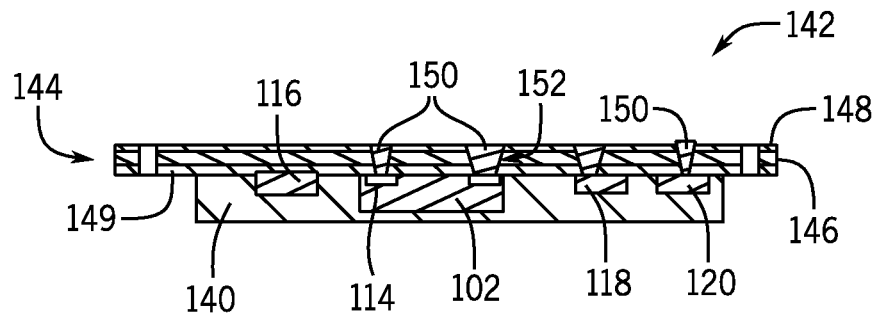
FIG. 7 is a schematic cross-sectional diagram of a modular electronics package for packaging a wide-bandgap semiconductor device, according to embodiment of the invention.

Referring now to FIG. 7, a cross-sectional schematic diagram of a modular electronics package 142 for packaging a GaN transistor 102 or another wide-bandgap semiconductor device is illustrated according to another embodiment. The electronics package 142 includes a GaN transistor 102 (such as illustrated in FIG. 1) attached to a metallized insulating substrate 144 that is formed of an insulating layer 146 and a metal layer 148 positioned on one side of the insulating layer 146. According to the embodiment of FIG. 7, GaN transistor 102 is attached to the metallized insulating substrate 144 by adhering the GaN transistor 102 to the insulating layer 146 via a component attach material 149, with a direct metallization then being formed to the contact pads 114 of the GaN transistor 102.

As previously indicated, insulating layer 146 may be provided in the form of an insulating film or dielectric substrate, such as for example a Kapton® laminate flex, an organic film, or substrate comprising polyimide, epoxy, BT resin, although other suitable materials may also be employed, such as Ultem®, polytetrafluoroethylene (PTFE), or another polymer film, such as a liquid crystal polymer (LCP) or a polyimide substrate, or inorganic substrates such as Si, SiC, AlN, ceramic, or glass, as non-limiting examples.

According to various embodiments, component attach material 149 is an electrically insulating material that is applied to insulating layer 146 by spin coating, spray coating, meniscus coating, printing, or in film form. Component attach material 149 may be a polymeric material (e.g., epoxy, silicone, liquid crystal polymer, or a ceramic, silica, or metal filled polymer) or other organic material as non-limiting examples. In some embodiments, component attach material 149 is provided on insulating layer 146 in either an uncured or partial cured (i.e., B-stage) form. Alternatively, component attach material 149 may be applied to the GaN transistor 102 prior to coupling of the device to the insulating layer 146.

Direct metallized connections are made to contact pads 114 of GaN transistor 102 (as well as to resistor 118 and capacitor 120) by way of conductive vias 150 that are formed down through microvias 152 in insulating layer 146 and component attach material 149. Microvias 152 are formed through insulating layer 146 and component attach material 149 at locations corresponding to contact pads 114 on GaN transistor 102, with microvias 152 having a diameter of 50 micrometers, for example. The conductive vias 150 are then formed in microvias 152, with the conductive vias 150 being composed of one or more electrically conductive materials. In an exemplary embodiment, the conductive vias 150 may be composed of a barrier or adhesion layer, a seed layer, and a relatively thick layer of bulk material that is plated atop the seed and barrier layers to form the conductive via. In alternative embodiments, the barrier layer and/or the seed layer may be omitted. The barrier layer, when used, is applied prior to application of the seed layer and bulk material. The barrier layer may include titanium or chromium, as non-limiting examples. When used, seed metal layer may be an electrically conductive material such as copper, as one non-limiting example. The layer of bulk material is plated up to fill microvia 152, with the bulk material including at least one electrically conductive material such as copper, aluminum, gold, silver, nickel, or combinations thereof as nonlimiting examples. Alternatively, conductive vias 150 may be formed of an electrically conductive polymer or formed using inks that contain conductive metal particles.

Figure 8:
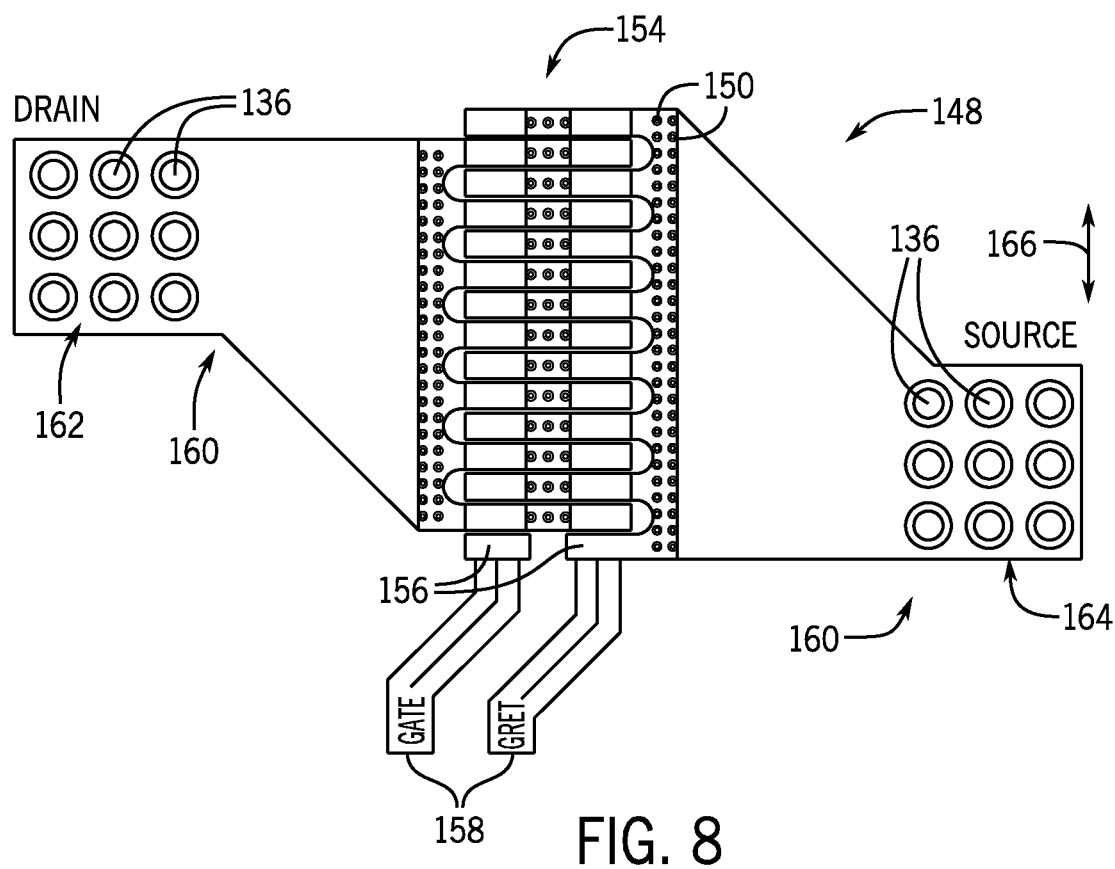
FIG. 8 is a plan view of a metal layer of a metallized insulating substrate included in the electronics package of FIG. 7, according to an embodiment of the invention.

Referring now to FIG. 8, a detailed view of metal layer 148 is illustrated. Similar to top metal layer 108 and bottom metal layer 110 in electronics package 100, metal layer 148 may be formed of copper or another suitable electrically conductive metallic material. Metal layer 148 includes a device attachment area 154 where connections to GaN transistor 102 are made, with conductive vias 150 being electrically coupled to metal layer 148 and extending down through insulating layer 146 and component attach material 149 to contact pads of GaN transistor 102. Metal layer 148 also provides connection points 156 to which gate connections 158 may be attached/formed to operatively connect gate driver 116 to GaN transistor 102—with gate in and gate out connections 158 being connected/formed to device attachment area of metal layer 148. Metal layer 148 further includes protrusions 160 extending out from attachment area 154, with drain and source connections 162, 164 being provided on the protrusions 160. Conductive package through vias 136 are formed through metallized insulating substrate 144 at the drain and source connections 162, 164 to provide electrical connectivity through the electronics package 142. As can be seen in FIG. 8, the drain and source connections 162, 164 are offset from one another in a direction 166, with this offset enabling stacking of electronics packages 142, as will be explained in greater detail below.

Referring back now to FIG. 7, electronics package 142 also includes a molding resin or encapsulant 140 (i.e., glob top) that surrounds the GaN transistor 102 and associated gate driver 116, capacitor, and resistor. According to an embodiment, encapsulant 140 is an organic resin containing fillers to reduce its thermal coefficient of expansion, which is less than 40 PPM/C or less than 30 PPM/C. Alternatively, encapsulant 140 may be a polymer such as, for example, an epoxy material, a pre-preg material, an inorganic material, a composite dielectric material, or any other electrically insulating organic or inorganic material. The top surface of encapsulant 140 presents a planar surface that enables positioning of the electronics package 142 adjacent an electronics package 142 of similar/identical construction— with a back-to-back arrangement of such packages made possible by such a planar surface.

Figure 9:
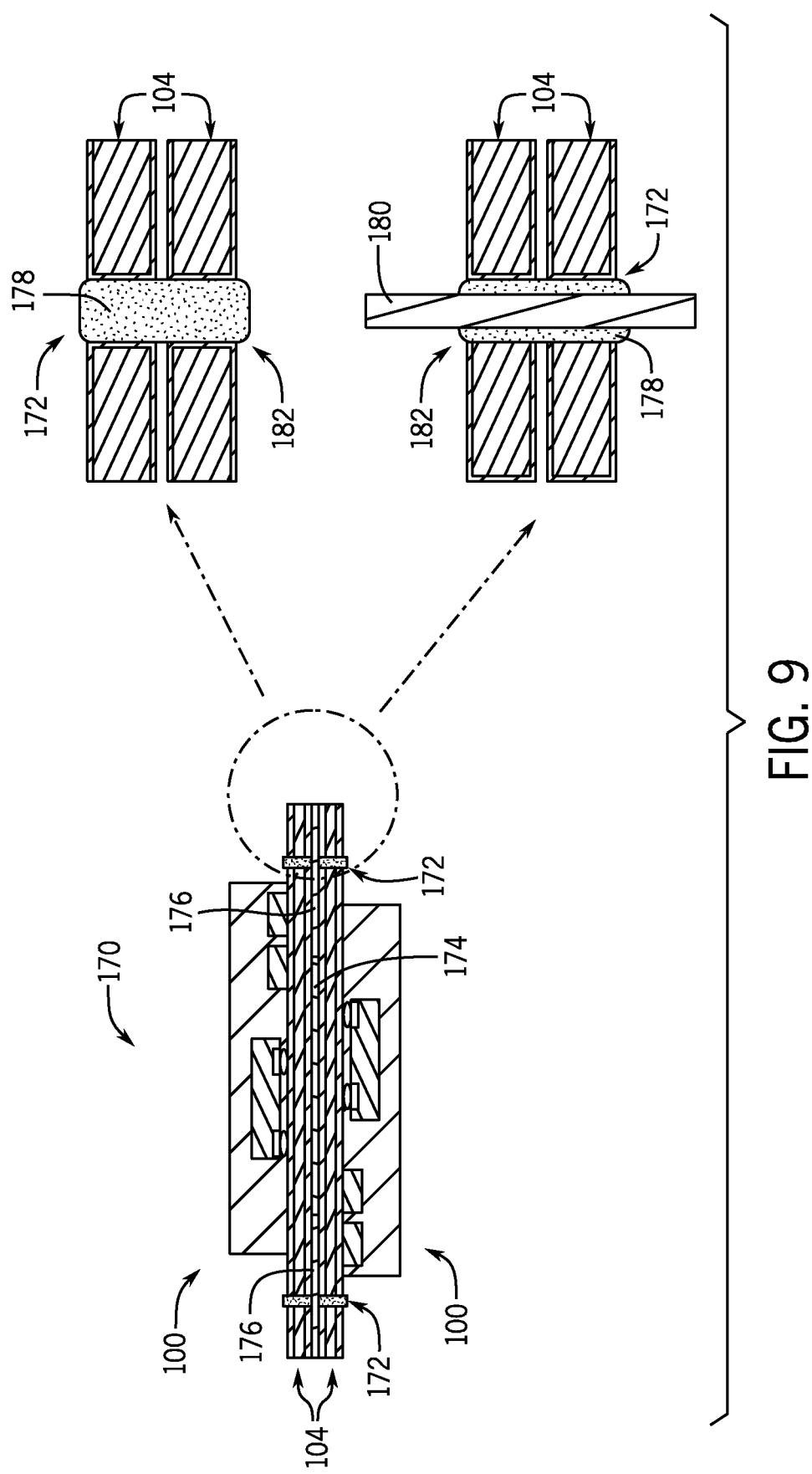
FIG. 9 is a schematic cross-sectional diagram of a half-bridge unit cell, according to an embodiment of the invention.

Referring now to FIG. 9, the stacking of electronics packages 100, 142 such as those shown in FIGS. 5 and 7 to form a modular half-bridge unit cell 170 is illustrated according to an embodiment of the invention. While FIG. 9 specifically illustrates electronics packages 100 according to the embodiment of FIG. 5, it is recognized that the electronics packages 142 according to the embodiment of FIG. 7 would be similarly stacked. To provide for stacking of electronics packages 100, the metallized insulating substrate 104 of each package is processed to form through-vias 172 therein. Through-vias 172 are formed through the metallized insulating substrate 104 by laser ablation, chemical etch, or plasma etch, for example. According to an exemplary embodiment, the through-vias 172 are formed to have a diameter of 500 micrometers, so as to be able to provide connections capable of high current operations.

In stacking the electronics packages 100 in a modular fashion, the electronics packages 100 are arranged in a back-to-back orientation, with the through-vias 172 in each package being aligned with one another. An insulating spacer 174 is then positioned between the electronics packages 100 to provide for electrical isolation therebetween— i.e., between sections of the bottom metal layer 110 of each package. Similar to insulating layers, insulating spacer 174 may be provided in the form of an insulating film or dielectric substrate, such as for example a Kapton® laminate flex, an organic film, or substrate comprising polyimide, epoxy, BT resin, although other suitable materials may also be employed, such as Ultem®, polytetrafluoroethylene (PTFE), or another polymer film, such as a liquid crystal polymer (LCP) or a polyimide substrate, or inorganic substrates such as Si, SiC, AlN, ceramic, or glass, as non-limiting examples.

A conductive joining material 176, such as solder, solder paste, or a localized conductive adhesive is applied to portions of metal layers 110 left exposed by insulating spacer 174 at desired locations thereon, and solder 178 or a combination of a pin 180 and solder 178 is inserted/applied into through-vias 172 to form conductive through-vias 182. The combination of the conductive joining material 176 and the conductive through-vias 182 provides for joining and alignment of the electronics packages 100 together and for electrical connectivity between the electronics packages 100. As previously indicated, conductive through-vias 182 may have a diameter of 500 micrometers, so as to be able to provide electrical connections between the electronics packages 100 that are capable of high current operations.

Figure 10B:
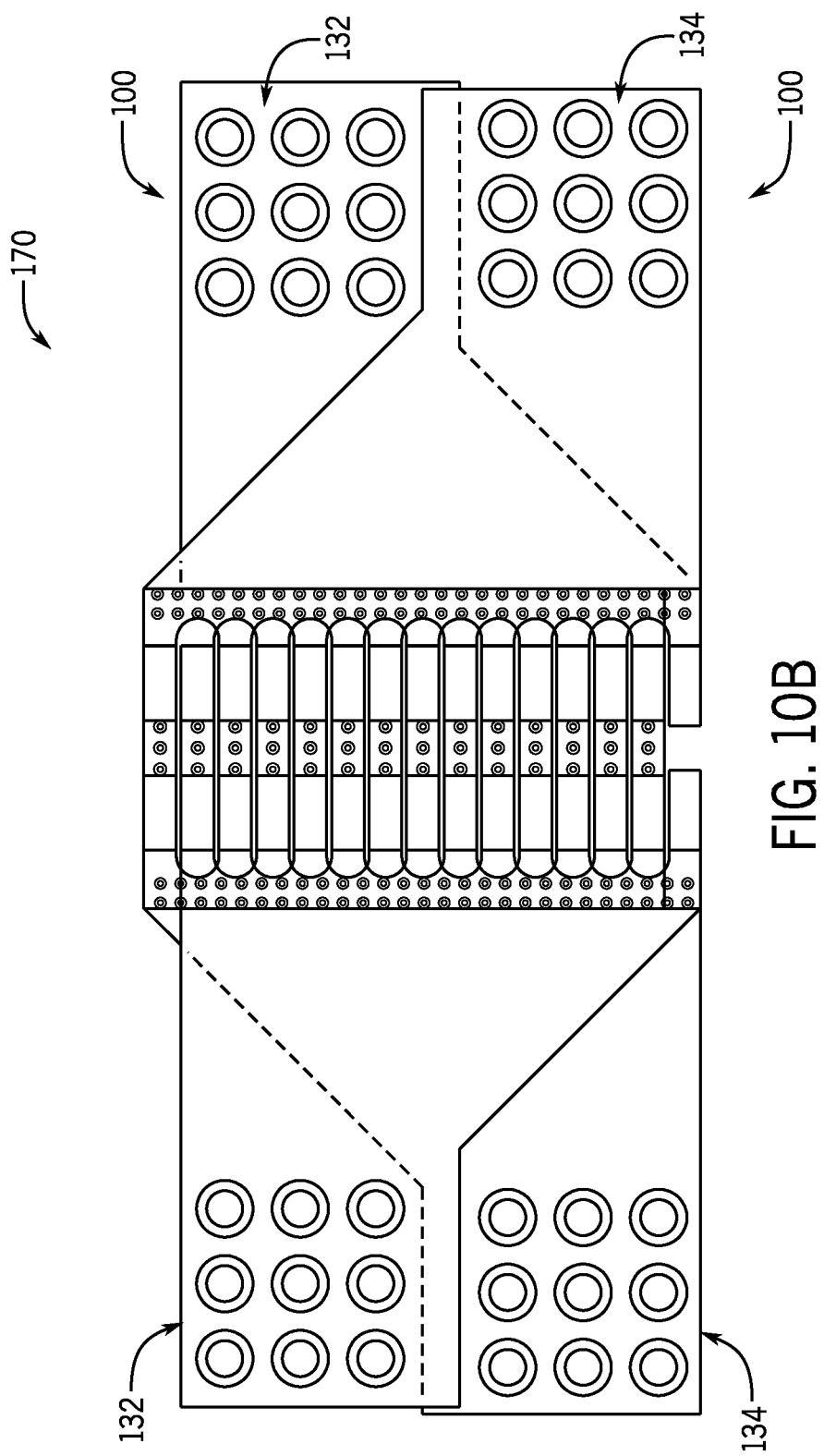
Figure 11:
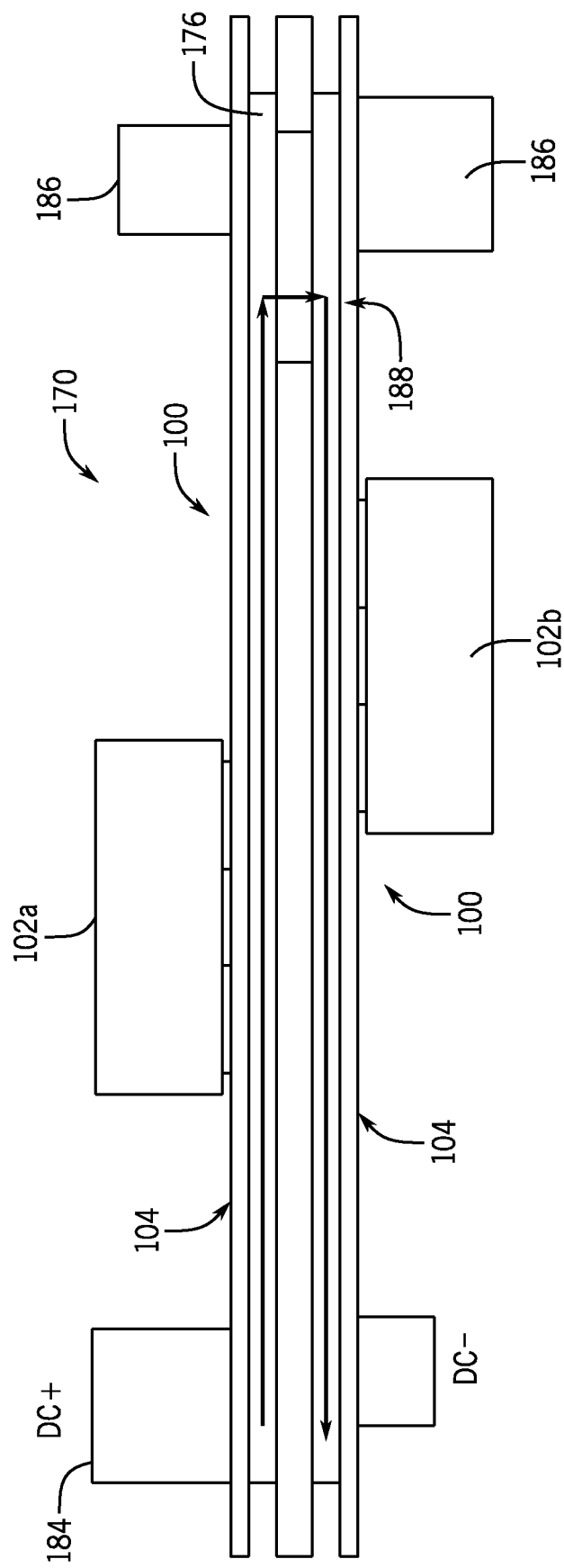
FIG. 11 is a perspective view of the half-bridge unit cell of FIG. 9, including DC and AC connections to the half-bridge unit cell.

Referring now to FIGS. 10A and 10B and FIG. 11, alternative views of the modular half-bridge unit cell 170 are provided that illustrate the stacking of electronics packages 100 (or electronics packages 142). As shown in FIGS. 10A and 10B and FIG. 11, the flipping of electronics packages 100 relative to one another when joining them in a stacked arrangement results in an offsetting of the drain and source connections 132, 134, as well as an offsetting of +/−DC terminals 184 and AC terminals 186 to the electronics packages 100. According to embodiments of the invention, the drain and source connections 132, 134 may be completely offset from one another (FIG. 10A) or may partially overlap one another (FIG. 10B) to provide an AC low impedance path. Offsetting of the +/−DC terminals 184 and AC terminals 186 of the electronics packages 100 allows for external power connections to be easily made to the packages, such as via a lead frame, direct welded leads (such as battery interconnects), pressure contact connections, etc. Additionally, while the +/−DC terminals 184 and AC terminals 186 are offset horizontally from one another, the +/−DC terminals 184 and AC terminals 186 are oriented to overlap in the vertical direction, so as to minimize inductance in the half-bridge unit cell 170.

The stacking of the electronics packages 100, 142 as illustrated in FIGS. 9-11 provides a half bridge unit cell 170 comprising a "high side switch" 102a and a "low side switch" 102b in the form of the packaged GaN transistors 102 (or other wide bandgap material semiconductor switches). The 3D stacking of the GaN transistors 102 allows for a half-bridge unit cell 170 that provides a current path through the high side switch 102a and a close coupled return current path through the low side switch 102b in the opposite flow direction, with the current path indicated by arrows 188 in FIG. 11. This allows for cancellation of the fields generated during switching and minimization of the path length between the DC+ and DC− of the half-bridge unit cell 170, thereby minimizing inductance.

Figure 12:
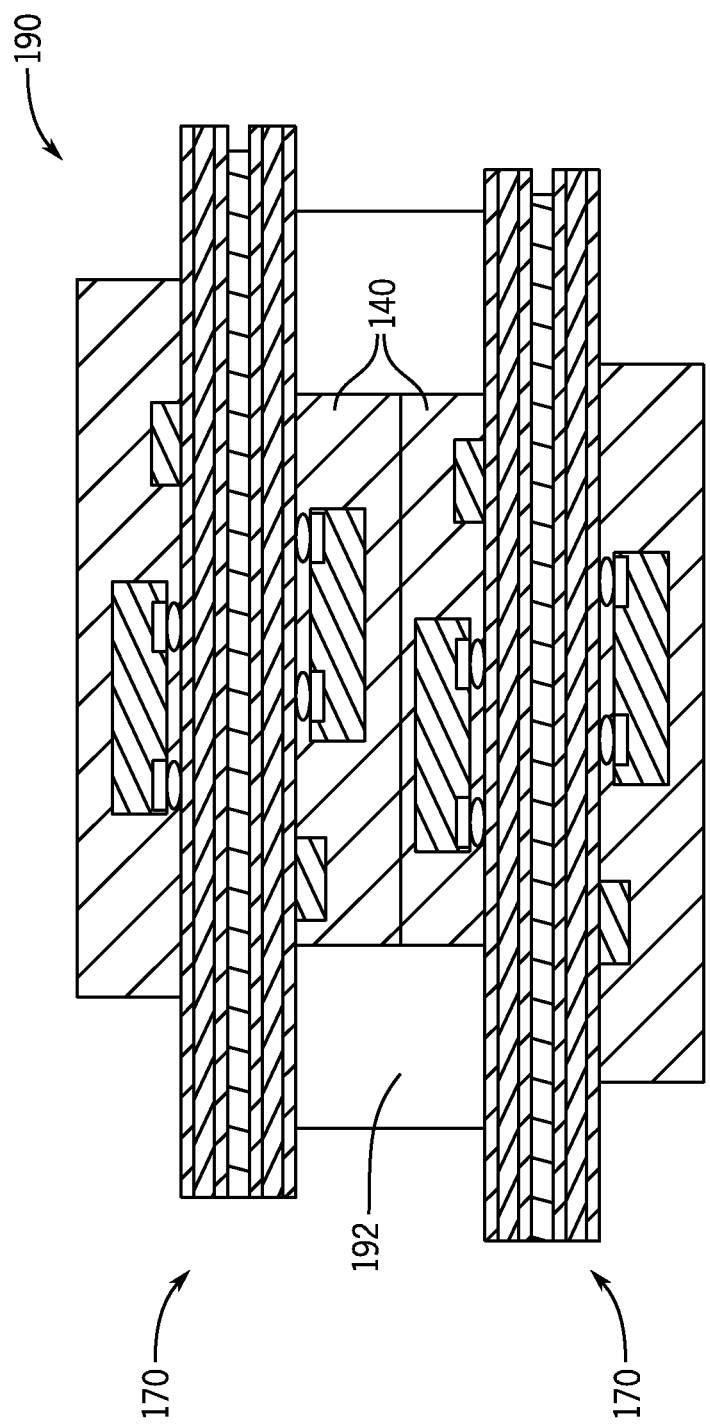
FIG. 12 is a schematic cross-sectional diagram of a high-power switching module formed from the half-bridge unit cells of FIG. 9, according to an embodiment of the invention.

According to an embodiment of the invention, it is recognized that multiples of the half-bridge unit cell 170 may be stacked together to provide a circuit suitable with higher power operation capabilities and/or power conversion capabilities. An illustration of multiple half-bridge unit cells 170 arranged in a stacked configuration to form a switching module 190 is illustrated in FIG. 12, with a pair of half-bridge unit cells 170 being stacked vertically. Each of the half-bridge unit cells 170 is of identical construction, so as to provide modularity in constructing the switching module 190. In order to physically and thermally couple the half-bridge unit cells 170 together, a thermal interface material (TIM) 192 is provided between the two-half-bridge unit cells 170 in an area about the encapsulant 140 included in each of the half-bridge unit cells 170. The TIM 192 provides for heat dissipation from each of the half-bridge unit cells 170 and enables stacking of multiple unit cells. Examples of suitable TIMs include, without limitation, adhesives, greases, gels, pads, films, liquid metals, compressible metals, and phase change materials. Liquid metal TIMs, for example, are typically indium-gallium alloys that are in liquid state over temperatures typically encountered in power electronics applications. Compressible metals are sufficiently soft to make intimate contact between a package mating surfaces and may include, for example, indium. While only two half-bridge unit cells 170 are shown stacked in the embodiment of FIG. 12, it is recognized that additional half-bridge unit cells 170 could be added to the stack, with the TIM 192 being provided between each pair of half-bridge unit cells 170 added to the switching module 190.

According to one embodiment of the invention, the two half-bridge unit cells 170 of switching module 190 may be operatively connected in a parallel arrangement to increase current handling capability of the switching module 190 (i.e., provide a high-power switching module), while still maintaining low inductance interconnects. According to another embodiment of the invention, the two half-bridge unit cells 170 of switching module 190 may be operatively connected to provide a switching module 190 that operates as a full-bridge circuit to provide desired power conversion capabilities.

Figure 13:
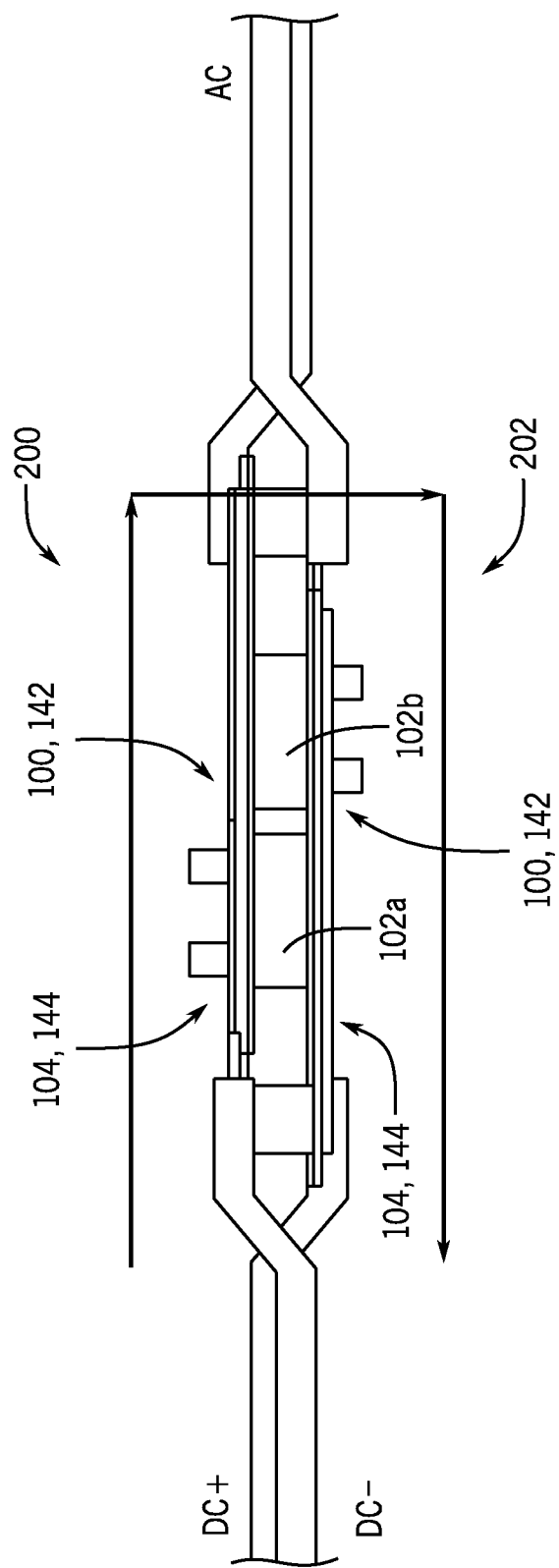
FIG. 13 is a schematic cross-sectional diagram of a half-bridge unit cell, according to another embodiment of the invention.

Referring now to FIG. 13, a half-bridge unit cell 200 is illustrated according to an additional embodiment of the invention. Each of electronics packages 100, 142 included in the half-bridge unit cell 200 may be similar to those shown in the embodiments of FIG. 5 or FIG. 7, except that the GaN transistors 102 may be positioned so as to be further off-center on the metallized insulating substrate 104, 144. This positioning off-center of the GaN transistors 102 provides for stacking of the electronics packages 100, 142 in a front-to-front arrangement to form the half-bridge unit cell 200 of FIG. 13, rather than stacking the electronics packages 100, 142 in a back-to-back arrangement as in the half-bridge unit cell 170 of FIG. 9. Stacking of the electronics packages 100, 142 in a front-to-front arrangement positions the GaN transistors 102 in a side-by-side arrangement in close proximity to one another and positions them in a space formed between metallized insulating substrates 104, 144. This positioning of the GaN transistors 102 allows access to high heat areas thereof, enabling thermal dissipation of heat from the half-bridge unit cell 200. Additionally, stacking of the electronics packages 100, 142 in a front-to-front arrangement provides a current path through the high side switch 102a and a close coupled return current path through the low side switch 102b in the opposite flow direction, with the current path indicated by arrows 202 in FIG. 13. This allows for cancellation of the fields generated during switching and minimization of the path length between the DC+ and DC− of the half-bridge unit cell 200, thereby minimizing inductance. Additionally, and similar to the half-bridge unit cell 170 of FIG. 9, offsetting of DC and AC terminals of the packages 100, 142 allows for external power connections to be easily made to the packages.

Figure 14A:
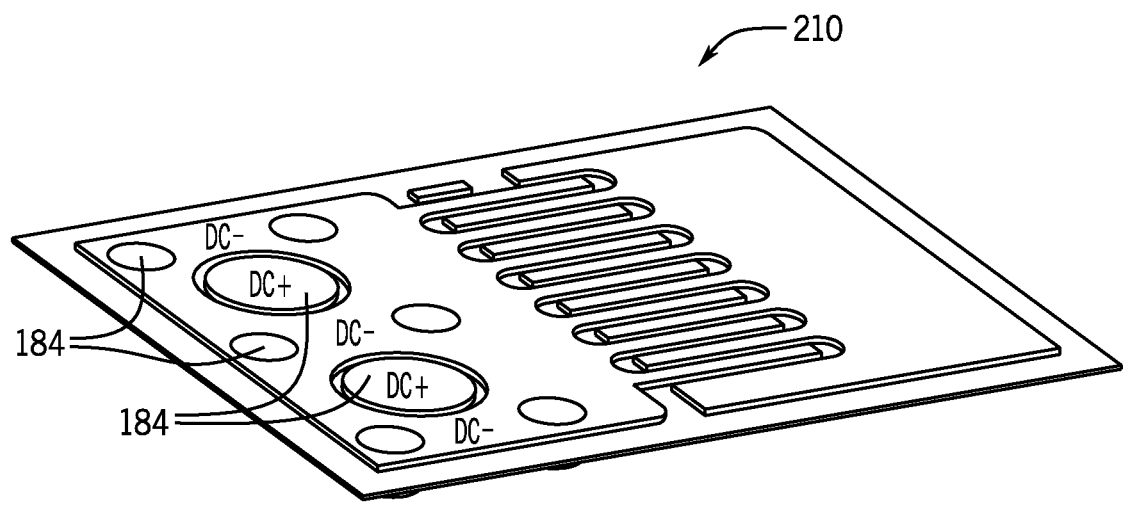
FIGS. 14A and 14B are top and bottom perspective views of a modular electronics package for packaging a wide-bandgap semiconductor device, according to an embodiment of the invention.
Figure 14B:
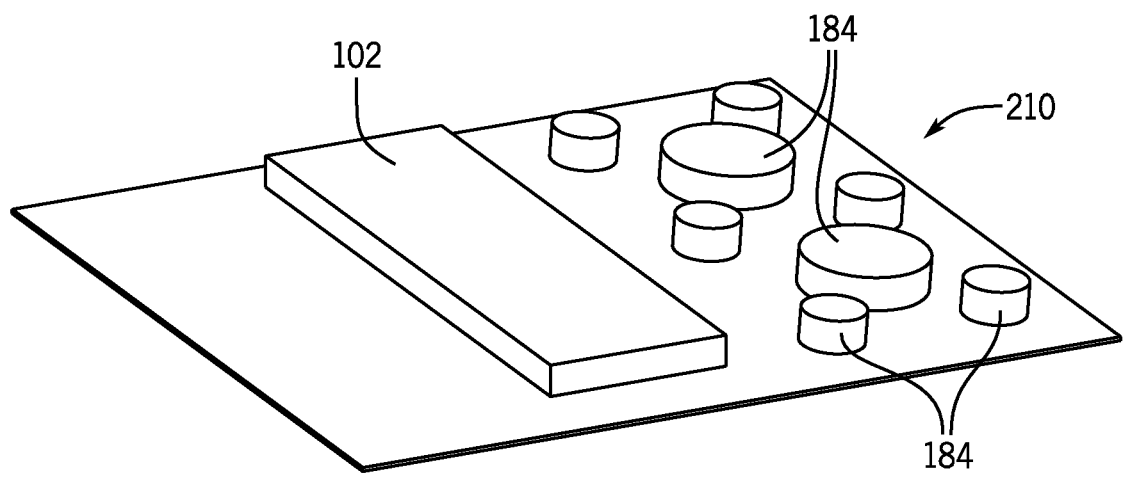

Referring now to FIGS. 14A and 14B, another embodiment is illustrated in which an electronics package 210 is provided for the GaN transistor 102 that provides for further reduction of the overall inductance in a half-bridge unit cell. As shown in FIGS. 14A and 14B, DC+ and DC− connections 184 are provided in a coaxial configuration that provides more interconnection options and a higher number of return paths to further reduce the overall inductance when stacking packages 210 to form a half-bridge unit cell. The coaxial configuration of the connections 184 supports further paralleling of half-bridge unit cells, to increase the overall current capability of a power converter.

Beneficially, embodiments of the invention thus provide packaging designs that allow for direct integration of GaN devices or other solid-state semiconductor devices therein, either using direct metallization power overlay connections or flip-chip attachment. The electronics packages may be used as building blocks to be arranged with identical electronics packages using a 3D stacking to provide a half-bridge unit cell that can later be stacked for higher power operation. The pair of devices in the half-bridge unit cell are packaged in close proximity to one another, so as to provide a low inductance commutation loop. The arrangement of the devices forms a current path through the high side switch and a close coupled return current path through the low side switch in the opposite flow direction, so as to allow for cancellation of the fields generated during switching of the devices and minimization of the path length between the DC+ and DC− of the half-bridge unit cell, thereby minimizing inductance. Accordingly, packaging designs of the present invention can reduce the overall commutation loop to 0.5 nH or less for the half-bridge configuration without additional EMI or localized bus capacitance, so as to allow for device level switching performance with minimal package parasitic impacts.

The packaging designs of the present invention also beneficially support a complex interdigitated planar style design or standard top metal planar configurations. These designs allow planar configurations, but are geared toward building in 3D in order to achieve the return loop for the current and thus cancellation of the fields generated during switching, thus minimizing the inductance. The modularity of the electronics packages, and the 3D stackability provided thereby, provides the ability to customize and integrate additional support components, such as introducing bus capacitors inside the embedded structure directly at the DC bus interconnects or for use as EMI capacitors, and also supports the high power density for integration of many devices, close packed configurations such as battery cells, or for extremely low profile package integration in areas such as wheel wells or motor housings. Additionally, the packaging designs allow for access to multiple sides of the switching devices (e.g., backside and edges) to support higher level of integration and access for thermal dissipation/heatsinking. For the power overlay configuration, the thickness of the copper can be substantial to support the high current capacity of the devices and can support fine feature function and integration, such as gate driver and source kelvin functions. The standard polyimide or flexible polymers have thinner cross sections to support similar voltage ratings, which further allows the structure to be in close proximity to further reduce the parasitic inductance. These packaging configurations also present the ability to create discrete packaged unit cells by molding/glob top/encapsulation that could be used as functional blocks in standard PCB designs in a land grid or ball grid connection format due to the base functionality and integration of the aforementioned components within the unit cell (gate driver/bus caps/EMI caps, etc.).

Therefore, according to one embodiment of the invention, a modular electronics package includes a pair of electronics packages comprising a first electronics package and a second electronics package, with each of the first and second electronics packages including a metallized insulating substrate comprising an insulating layer and a first conductor layer positioned on the insulating layer and a solid-state switching device positioned on the metallized insulating substrate, the solid-state switching device comprising a plurality of contact pads electrically coupled to the first conductor layer of the metallized insulating substrate. The modular electronics package also includes a conductive joining material positioned between the first electronics package and the second electronics package to electrically connect the first electronics package to the second electronics package. The first electronics package and the second electronics package are stacked with one another to form a half-bridge unit cell, with the half-bridge unit cell having a current path through the solid-state switching device in the first electronics package and a close coupled return current path through the solid-state switching device in the second electronics package in opposite flow directions.

According to another embodiment of the invention, a method of manufacturing a half-bridge unit cell includes providing a first electronics package and a second electronics package of identical construction, with each of the first and second electronics packages including a metallized insulating substrate comprising an insulating layer and a metal layer positioned on the insulating layer and a solid-state switching device positioned on the metallized insulating substrate and electrically coupled thereto. The method also includes forming a plurality of through-vias in the metallized insulating substrate of each of the first and second electronics packages that extend through the metallized insulating substrate and vertically stacking the first electronics package with the second electronics package, with the plurality of through-vias in the metallized insulating substrate of the first electronics package being aligned with the plurality of through-vias in the metallized insulating substrate of the second electronics package. The method further includes physically and electrically coupling the first electronics package with the second electronics package to form a commutation loop in the half-bridge unit cell.

According to yet another embodiment of the invention, a half-bridge unit cell includes a first electronics package comprising a first wide-bandgap semiconductor switch coupled to a first metallized insulating substrate, the first wide-bandgap semiconductor switch electrically connected to a conductor layer of the first metallized insulating substrate and a second electronics package comprising a second wide-bandgap semiconductor switch coupled to a second metallized insulating substrate, the second wide-bandgap semiconductor switch electrically connected to a conductor layer of the second metallized insulating substrate. The first electronics package is stacked vertically with the second electronics package and electrically coupled thereto to form a commutation loop in the half-bridge unit cell, with an inductance of the commutation loop in the half-bridge unit cell being 0.5 nH or less.

Embodiments of the present invention have been described in terms of the preferred embodiment, and it is recognized that equivalents, alternatives, and modifications, aside from those expressly stated, are possible and within the scope of the appending claims.

What is claimed is:

1. A modular electronics package comprising:
    a pair of electronics packages comprising a first electronics package and a second electronics package, each of the first and second electronics packages comprising:
        a metallized insulating substrate comprising an insulating layer and a first conductor layer positioned on the insulating layer; and
        a solid-state switching device positioned on the metallized insulating substrate, the solid-state switching device comprising a plurality of contact pads electrically coupled to the first conductor layer of the metallized insulating substrate; and
    a conductive joining material positioned between the first electronics package and the second electronics package to electrically connect the first electronics package to the second electronics package;
    wherein the first electronics package and the second electronics package are stacked with one another to form a half-bridge unit cell, with the half-bridge unit cell having a current path through the solid-state switching device in the first electronics package and a close coupled return current path through the solid-state switching device in the second electronics package in opposite flow directions.

2. The electronics package of claim 1 wherein the current path and the return current path through the solid-state switching devices in the first and second electronics packages provide cancellation of fields generated during switching of the solid-state switching devices, so as to reduce a commutation loop inductance in the half-bridge unit cell.

3. The electronics package of claim 1 wherein the commutation loop inductance in the half-bridge unit cell is 0.5 nH or less.

4. The electronics package of claim 1 wherein the metallized insulating substrate of at least one of the first electronics package and the second electronics package comprises a plurality of conductive vias formed through the insulating layer, the plurality of conductive through-vias electrically coupled to the first conductor layer and in direct contact with the plurality of contact pads.

5. The electronics package of claim 4 wherein at least one of the first electronics package and the second electronics package further comprises a component attach material coupling the solid-state switching device to the metallized insulating substrate, and wherein the plurality of conductive vias is formed through the insulating layer and the component attach material to be in direct contact with the plurality of contact pads.

6. The electronics package of claim 1 wherein the metallized insulating substrate of at least one of the first electronics package and the second electronics package further comprises a second conductor layer positioned on the insulating layer on a side thereof opposite first conductor layer, and wherein the solid-state switching device is joined to the first metal layer of the metallized insulating substrate via a flip-chip attachment.

7. The electronics package of claim 1 wherein at least one of the first electronics package and the second electronics package further comprises at least one additional electrical component positioned on the metallized insulating substrate, and at least one additional electrical component including one or more of a gate driver, a resistor, and a capacitor.

8. The electronics package of claim 7 wherein the at least one of the first electronics package and the second electronics package further comprises an encapsulant that surrounds the solid-state switching device and the at least one additional electrical component.

9. The electronics package of claim 1 wherein the first electronics package and the second electronics package are stacked in a back-to-back arrangement, such that the metallized insulating substrates of the electronics packages are adjacent one another.

10. The electronics package of claim 9 further comprising an insulating spacer positioned between the metallized insulating substrates of the first and second electronics packages, with the conductive joining material positioned at locations between the first and second electronics packages left exposed by the insulating spacer.

11. The electronics package of claim 9 wherein the metallized insulating substrate of each of the first and second electronics packages includes a plurality of through-vias formed therein, with the through-vias of the first electronics package and the through-vias of the second electronics package being aligned with one another.

12. The electronics package of claim 11 further comprising conductive through-vias positioned in the plurality of through-vias to electrically connect the first electronics package to the second electronics package, the conductive through-vias comprising one of a solder fill or a solder fill and pin.

13. The electronics package of claim 1 wherein the first electronics package and the second electronics package are stacked in a front-to-front arrangement, such that the solid-state switching devices of the first and second electronics packages are positioned between the metallized insulating substrates of the electronics packages, with the solid-state switching devices being adjacent one another in a side-by-side arrangement.

14. The electronics package of claim 1 wherein the metallized insulating substrate comprises drain and source connections thereon, and wherein the drain and source connections of the first electronics package and the drain and source connections of the second electronics package are offset from one another when stacked with one another to form the half-bridge unit cell.

15. The electronics package of claim 1 further comprising an additional pair of electronics packages comprising a third electronics package and a fourth electronics package that are stacked with one another to form another half-bridge unit cell, with the half-bridge unit cell formed by the third and fourth electronics packages operatively connected with the half-bridge unit cell formed by the first and second electronics packages to form a full-bridge circuit or a pair of parallel connected half-bridge unit cells.

16. The electronics package of claim 15 wherein the half-bridge unit cell formed by the first and second electronics packages is stacked with the half-bridge unit cell formed by the third and fourth electronics packages, with a thermal interface material positioned between the half-bridge unit cells.

17. A method of manufacturing a half-bridge unit cell comprising:
proving a first electronics package and a second electronics package of identical construction, each of the first and second electronics packages comprising:
a metallized insulating substrate comprising an insulating layer and a metal layer positioned on the insulating layer; and
a solid-state switching device positioned on the metallized insulating substrate and electrically coupled thereto;
forming a plurality of through-vias in the metallized insulating substrate of each of the first and second electronics packages that extend through the metallized insulating substrate;
vertically stacking the first electronics package with the second electronics package, with the plurality of through-vias in the metallized insulating substrate of the first electronics package being aligned with the plurality of through-vias in the metallized insulating substrate of the second electronics package; and
physically and electrically coupling the first electronics package with the second electronics package to form a commutation loop in the half-bridge unit cell.

18. The method of claim 17 wherein physically and electrically coupling the first electronics package with the second electronics package comprises applying a conductive joining material between the first electronics package and the second electronics package.

19. The method of claim 18 wherein applying the conductive joining material comprises forming conductive through-vias positioned in the plurality of through-vias.

20. The method of claim 17 wherein providing each of the first electronics package and the second electronics package comprises:
- applying a component attach material to the insulating layer;
- coupling the solid-state switching device to the insulating layer via the component attach material;
- forming a plurality of conductive vias formed through the insulating layer and the component attach material and down to contact pads on the solid-state switching device, the plurality of conductive through-vias electrically coupled to the metal layer.

21. The method of claim 17 wherein providing each of the first electronics package and the second electronics package comprises physically and electrically coupling the solid-state switching device to the metal layer of the metallized insulating substrate via a flip-chip attachment.

22. The method of claim 17 wherein vertically stacking the first electronics package with the second electronics package comprises vertically stacking the first electronics package and the second electronics package in a back-to-back arrangement, such that the metallized insulating substrates of the electronics packages are adjacent one another; and
- wherein the method further comprises positioning an insulating spacer between the metallized insulating substrates of the first and second electronics packages.

23. The method of claim 17 wherein vertically stacking the first electronics package with the second electronics package comprises vertically stacking the first electronics package and the second electronics package in front-to-front arrangement, such that the solid-state switching devices of the first and second electronics packages are positioned between the metallized insulating substrates of the electronics packages, with the solid-state switching devices being adjacent one another in a side-by-side arrangement.

24. A half-bridge unit cell comprising:
- a first electronics package comprising a first wide-bandgap semiconductor switch coupled to a first metallized insulating substrate, the first wide-bandgap semiconductor switch electrically connected to a conductor layer of the first metallized insulating substrate; and
- a second electronics package comprising a second wide-bandgap semiconductor switch coupled to a second metallized insulating substrate, the second wide-bandgap semiconductor switch electrically connected to a conductor layer of the second metallized insulating substrate;
- wherein the first electronics package is stacked vertically with the second electronics package and electrically coupled thereto to form a commutation loop in the half-bridge unit cell, with an inductance of the commutation loop in the half-bridge unit cell being 0.5 nH or less.

25. The half-bridge unit cell of claim 24 wherein the first electronics package and the second electronics package are stacked in one of a back-to-back arrangement and a front-to-front arrangement, with the first and second metallized insulating substrates adjacent one another and the first and second wide-bandgap semiconductor switches opposite one another when in the back-to-back arrangement, and with the first and second wide-bandgap semiconductor switches positioned adjacent one another in a side-by-side arrangement between the first and second metallized insulating substrates when in the front-to-front arrangement.

26. The half-bridge unit cell of claim 24 wherein each of the first electronics package and the second electronics package comprises drain and source connections thereon, and wherein the drain and source connections of the first electronics package and the drain and source connections of the second electronics package are offset from one another when stacked vertically with one another.

27. The half-bridge unit cell of claim 24 wherein each of the first metallized insulating substrate and the second metallized insulating substrate comprises:
- an insulating layer having a plurality of vias formed therein; and
- a conductor layer positioned on the insulating layer and in the plurality of via, such that the conductor layer includes a plurality of conductive vias formed through the insulating layer;
- wherein the plurality of conductive vias are in direct contact with contact pads of a respective one of the first wide-bandgap semiconductor switch and the second wide-bandgap semiconductor switch.

* * * * *